United States Patent
Noda et al.

(10) Patent No.: US 8,803,150 B2
(45) Date of Patent: Aug. 12, 2014

(54) DISPLAY DEVICE AND MANUFACTURING PROCESS OF DISPLAY DEVICE

(75) Inventors: Takeshi Noda, Mobara (JP); Tetsufumi Kawamura, Kodaira (JP)

(73) Assignee: Japan Display Inc., Tokyo (JP)

( * ) Notice: Subject to any disclaimer, the term of this patent is extended or adjusted under 35 U.S.C. 154(b) by 16 days.

(21) Appl. No.: 13/596,089

(22) Filed: Aug. 28, 2012

(65) Prior Publication Data

US 2013/0048996 A1    Feb. 28, 2013

(30) Foreign Application Priority Data

Aug. 31, 2011    (JP) .................................. 2011-190006

(51) Int. Cl.
| | |
|---|---|
| *H01L 29/04* | (2006.01) |
| *H01L 31/20* | (2006.01) |
| *H01L 29/786* | (2006.01) |
| *H01L 27/12* | (2006.01) |

(52) U.S. Cl.
CPC .............. *H01L 29/786* (2013.01); *H01L 27/12* (2013.01)
USPC .............................. 257/59; 257/57; 438/158

(58) Field of Classification Search
CPC . H01L 27/1214; H01L 29/786; H01L 27/124; H01L 27/12; H01L 29/7869; H01L 29/41733; H01L 21/77; H01L 29/458; H01L 29/78693; H01L 27/3262; H01L 29/78696; H01L 33/36; H01L 27/1255; H01L 21/34

USPC ................. 257/59, 57, 43, E33.062, E21.46; 438/158

See application file for complete search history.

(56) References Cited

U.S. PATENT DOCUMENTS

| | | | |
|---|---|---|---|
| 6,855,954 B1 * | 2/2005 | Zhang .............................. | 257/59 |
| 2009/0101895 A1 * | 4/2009 | Kawamura et al. ............. | 257/43 |
| 2011/0042670 A1 | 2/2011 | Sato et al. | |

FOREIGN PATENT DOCUMENTS

JP    2009-272427    11/2009

* cited by examiner

*Primary Examiner* — Theresa T Doan
(74) *Attorney, Agent, or Firm* — Antonelli, Terry, Stout & Kraus, LLP.

(57) ABSTRACT

Provided a display device including a thin film transistor. The thin film transistor includes a gate electrode, a gate insulating layer which covers the gate electrode, an oxide semiconductor film above the gate insulating layer, a source electrode and a drain electrode which are respectively provided in contact with a first region and a second region, which are provided in the upper surface of the oxide semiconductor film, and a channel protective film which is provided in contact with a third region between the first region and the second region. In plan view, a region of the oxide semiconductor film, which overlaps with the gate electrode, is smaller than the third region, and a portion of the oxide semiconductor film except for a portion which overlaps with the gate electrode has a resistance lower than the portion.

9 Claims, 5 Drawing Sheets

FIG.3
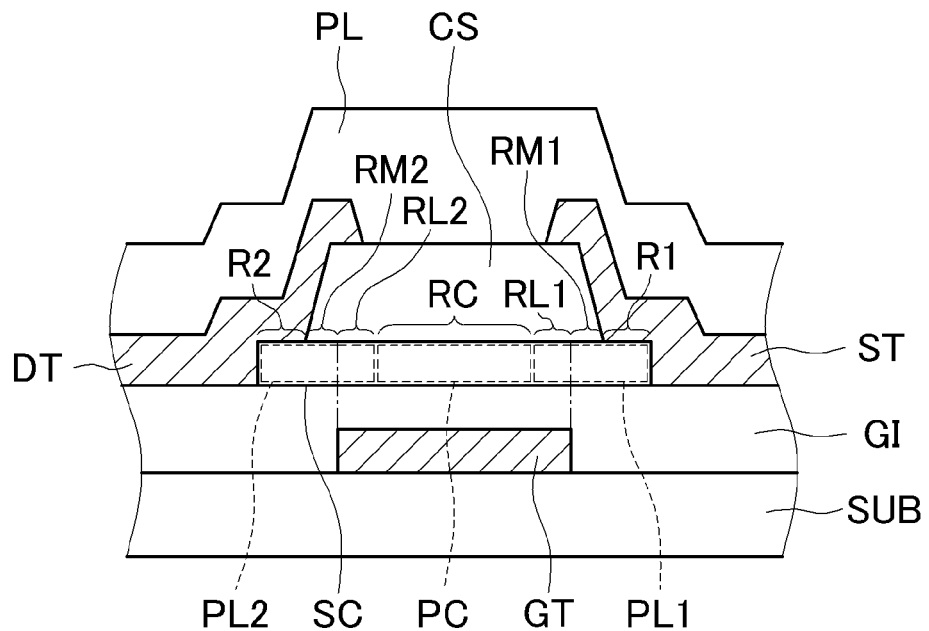
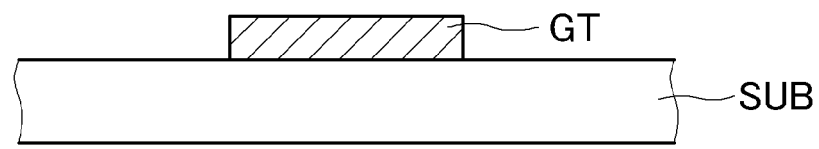
FIG.4A
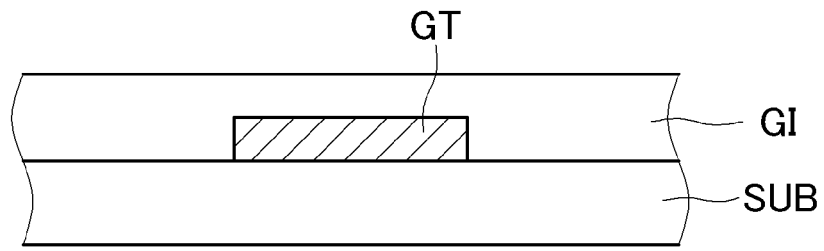
FIG.4B
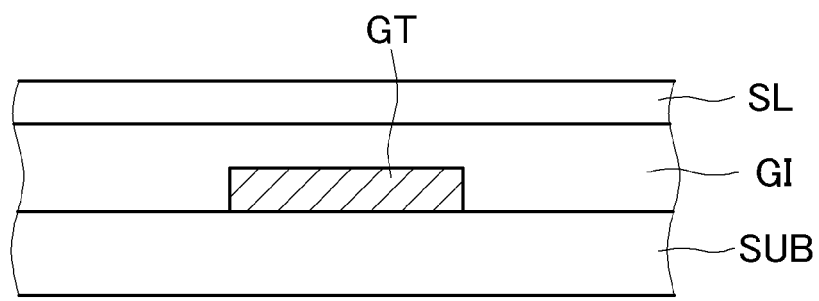
FIG.4C

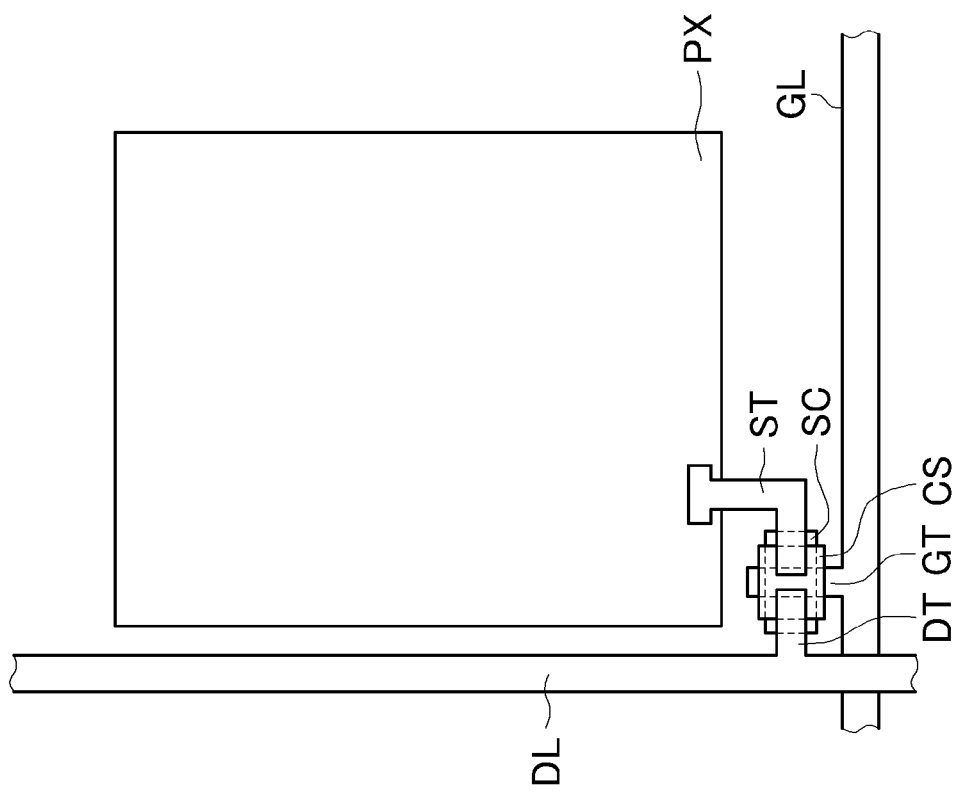
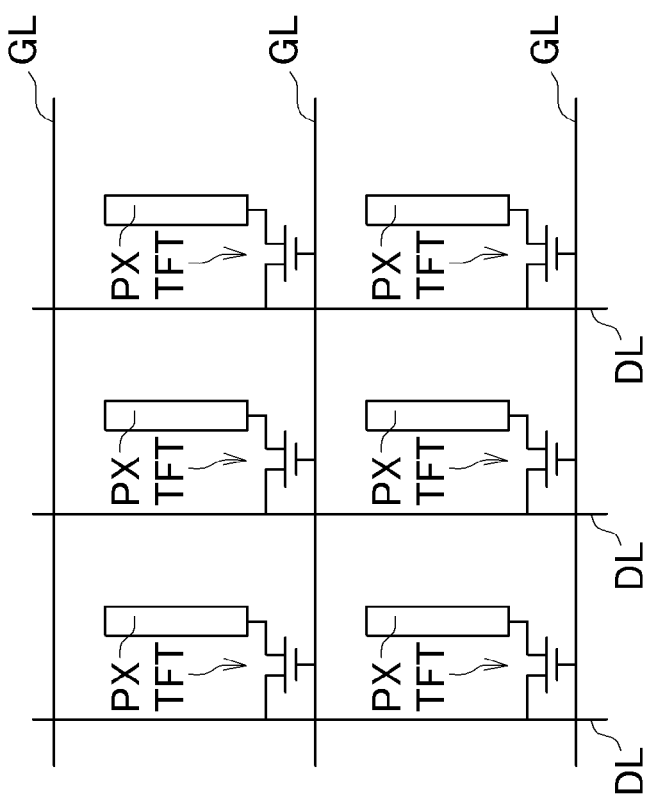

DISPLAY DEVICE AND MANUFACTURING PROCESS OF DISPLAY DEVICE

CROSS-REFERENCE TO RELATED APPLICATION

The present application claims priority from Japanese application JP 2011-190006 filed on Aug. 31, 2011, the content of which is hereby incorporated by reference into this application.

BACKGROUND OF THE INVENTION

1. Field of the Invention

The present invention relates to a display device and a manufacturing process of a display device.

2. Description of the Related Art

In recent years, a display device utilizing a thin film transistor using an oxide semiconductor has been actively developed. The display device includes pixel circuits arranged in matrix. This development is made for improving characteristics of the display device. Japanese Patent Application Laid-open No. 2009-272427 discloses a thin film transistor having a channel etch stop structure which uses the oxide semiconductor.

SUMMARY OF THE INVENTION

The oxide semiconductor is liable to change its characteristics by a material that is provided in contact with the oxide semiconductor, and hence, in some cases, the oxide semiconductor fails to operate as designed. For example, the oxide semiconductor becomes reduced with hydrogen, with the result that a threshold voltage thereof changes. Therefore, it is difficult to use a material containing a large amount of hydrogen at a position to be provided in contact with the oxide semiconductor. In order to obtain stable performance of the thin film transistor using the oxide semiconductor, it is preferred that, for a plurality of insulating members to be provided in contact with the oxide semiconductor, an insulating material having the best compatibility be used. For the above-mentioned reason, the inventors of the present invention have formed a gate insulating film, which is provided between a gate electrode and an oxide semiconductor film provided above the gate electrode, and a channel etch stopper, which is provided on the oxide semiconductor film, with use of the same insulating material. However, in this case, it has been found that the withstand voltage of the thin film transistor may decrease, or currents may leak via the gate electrode. This is because, when the channel etch stopper is subjected to etching, the gate insulating film is also subjected to etching via a through hole present in the oxide semiconductor so that a pinhole is generated.

The present invention has been made in view of the above-mentioned problem, and has an object to provide a display device using a thin film transistor, which is capable of preventing change in characteristics of an oxide semiconductor forming the thin film transistor and in which a withstand voltage characteristic thereof is improved, and to a manufacturing process for the display device.

Representative aspects of the invention disclosed herein are briefly outlined as follows.

(1) According to an exemplary embodiment of the present invention, there is provided a display device, including: an insulating substrate; and a thin film transistor formed on the insulating substrate. The thin film transistor includes: a conductive layer provided with a gate electrode; a gate insulating layer which is provided on the conductive layer and contains an insulating material; an oxide semiconductor film which is provided in contact with an upper surface of the gate insulating layer and is provided above the gate electrode; a source electrode which is provided in contact with a first region provided in an upper surface of the oxide semiconductor film; a drain electrode which is provided in contact with a second region spaced apart from the first region, the second region being provided in the upper surface of the oxide semiconductor film; and a channel protective film which contains the insulating material and is provided in contact with a third region provided between the first region and the second region, the third region being provided in the upper surface of the oxide semiconductor film. In plan view, a portion of the oxide semiconductor film, which overlaps with the gate electrode, is a part of a portion of the oxide semiconductor film, which overlaps with the channel protective film. A portion of the oxide semiconductor film except for a part of the portion of the oxide semiconductor film, which overlaps with the gate electrode, has a resistance lower than a resistance of the part of the portion of the oxide semiconductor film, which overlaps with the gate electrode.

(2) In the display device as described in the above-mentioned item (1), the insulating material is a silicon oxide.

(3) In the display device as described in the above-mentioned item (1) or (2), the oxide semiconductor film has, in plan view, a portion which overlaps with the third region between the portion which overlaps with the gate electrode and a portion which overlaps with the first region, and the oxide semiconductor film has, in plan view, a portion which overlaps with the third region between the portion which overlaps with the gate electrode and a portion which overlaps with the second region.

(4) In the display device as described in any one of the above-mentioned items (1) to (3), the third region is provided in contact with the first region and the second region.

(5) In the display device as described in any one of the above-mentioned items (1) to (4), the portion of the oxide semiconductor film except for the part of the portion of the oxide semiconductor film, which overlaps with the gate electrode, has an oxygen content lower than an oxygen content of the part of the portion of the oxide semiconductor film, which overlaps with the gate electrode.

(6) According to an exemplary embodiment of the present invention, there is provided a manufacturing process for a display device, including: forming a conductive layer provided with a gate electrode on an insulating substrate; forming a gate insulating layer containing an insulating material on the conductive layer; forming an oxide semiconductor layer on the gate insulating layer; deoxidizing a portion of the oxide semiconductor layer except for a part of a portion of the oxide semiconductor layer, which overlaps with the gate electrode in plan view; etching the oxide semiconductor layer so that a portion of the oxide semiconductor film provided above the gate electrode remains; forming a channel protective layer containing the insulating material; etching the channel protective layer so that a channel protective film remains, the channel protective film including a region of an upper surface of the oxide semiconductor film, which overlaps with the gate electrode in plan view, and being provided in contact with a region which is larger than the region; and forming a source electrode and a drain electrode, the source electrode being provided in contact with a first region of the upper surface of the oxide semiconductor film, which is different from a region thereof provided in contact with the channel protective film, the drain electrode being provided in contact with a second region of the upper surface of the oxide semiconductor film, which is different from the first region and the region thereof provided in contact with the channel protective film. The forming of the source electrode and the drain electrode includes forming the source electrode and the drain electrode so that the region provided in contact with the channel protective film is present between the first region and the second region.

According to the exemplary embodiments of the present invention, it is possible to provide the display device using the thin film transistor, which is capable of preventing change in characteristics of the oxide semiconductor forming the thin film transistor and in which the withstand voltage characteristic thereof is improved.

BRIEF DESCRIPTION OF THE DRAWINGS

In the accompanying drawings:

FIG. 3 is a sectional view of a thin film transistor included in the pixel circuit;

FIGS. 4A to 4F are sectional views illustrating manufacturing steps for the thin film transistor illustrated in FIG. 3;

FIG. 7 is a circuit diagram illustrating an equivalent circuit of another display device according to the embodiment of the present invention; and FIG. 8 is a plan view illustrating a configuration of a pixel circuit illustrated in FIG. 7.

DETAILED DESCRIPTION OF THE INVENTION

Figure 2:
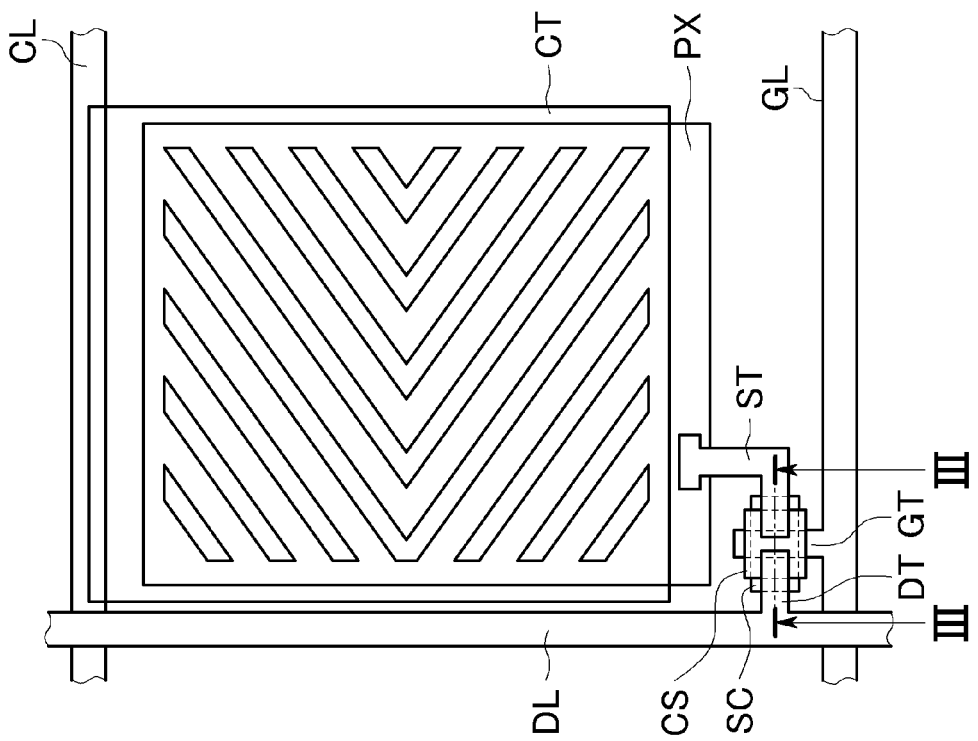
FIG. 2 is a plan view illustrating an example of a configuration of a single pixel circuit.

Hereinafter, an embodiment of the present invention is described with reference to the drawings. Of the components described herein, components having the same function are denoted by the same reference character, and description thereof is omitted. Note that, the embodiment to be described hereinafter is an example of a case where the present invention is applied to an in-plane-switching (IPS) type liquid crystal display device.

A display device according to this embodiment is a liquid crystal display device including an array substrate, a filter substrate, which is opposed to the array substrate and includes a color filter, a liquid crystal material sealed in a space sandwiched between both the substrates, and a driver IC mounted on the array substrate. The array substrate and the filter substrate are each an insulating substrate such as a glass substrate, which has been subjected to processing.

Figure 1:
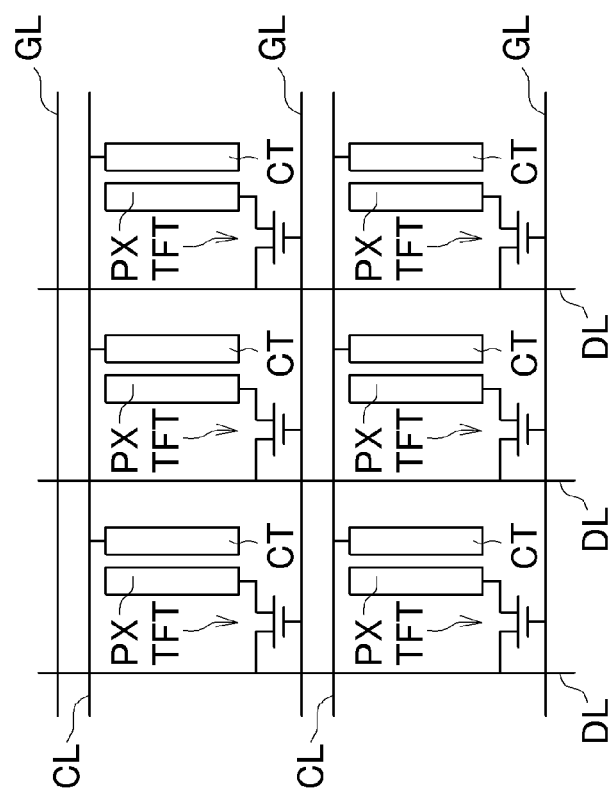
FIG. 1 is a circuit diagram illustrating an equivalent circuit of a display device according to an embodiment of the present invention.

FIG. 1 is a circuit diagram illustrating an equivalent circuit of the display device according to the embodiment of the present invention. The equivalent circuit illustrated in FIG. 1 corresponds to a part of a display region in the above-mentioned array substrate. In the array substrate, a large number of gate signal lines GL are arranged and extend in a lateral direction, and further, a large number of video signal lines DL are arranged and extend in a vertical direction. Those gate signal lines GL and video signal lines DL divide the display region into matrix-shaped sections, and each section corresponds to a single pixel circuit. Further, common signal lines CL extend in the lateral direction so as to correspond to the respective gate signal lines GL.

At a corner of the pixel circuit sectioned by the gate signal lines GL and the video signal lines DL, a thin film transistor TFT using an oxide semiconductor is formed, and a gate electrode GT thereof is connected to the gate signal line GL, while a drain electrode DT thereof is connected to the video signal line DL. Further, in each of the pixel circuits, a pixel electrode PX and a common electrode CT are formed in a pair. The pixel electrode PX is connected to a source electrode ST of the thin film transistor TFT, and the common electrode CT is connected to the common signal line CL.

FIG. 2 is a plan view illustrating an example of a configuration of a single pixel circuit. As illustrated in FIG. 2, the thin film transistor TFT is provided so as to correspond to a position at which the gate signal line GL and the video signal line DL intersect with each other. The thin film transistor TFT includes an oxide semiconductor film SC, a channel protective film CS (also referred to as channel etch stopper), the gate electrode GT, the source electrode ST, and the drain electrode DT. The thin film transistor TFT has a channel etch stop structure.

In the above-mentioned pixel circuit, a common voltage is applied to the common electrode CT of each pixel via the common signal line CL, and a gate voltage is applied to the gate signal line GL. In this manner, a row of the pixel circuits is selected. Further, at the timing of this selection, a video signal is supplied to each of the video signal lines DL, and thus a voltage of the video signal is applied to the pixel electrode PX included in each of the pixel circuits. With this, a lateral electric field is generated between the pixel electrode PX and the common electrode CT at an intensity corresponding to the voltage of the video signal. The orientation of liquid crystal molecules is determined based on the intensity of this lateral electric field.

The thin film transistor TFT is described in detail. The oxide semiconductor film SC is made of an oxide semiconductor. The oxide semiconductor is an amorphous or crystalline oxide semiconductor containing at least one element selected from the group consisting of In, Ga, Zn, and Sn. Examples of the oxide semiconductor include an In—Ga—Zn oxide, an In—Ga oxide, an In—Zn oxide, an In—Sn oxide, a Zn—Ga oxide, and a Zn oxide. The thickness of the oxide semiconductor film SC is desired to range from 5 nm to 200 nm, but may be out of this range. The drain electrode DT extends from the video signal line DL in a right direction of FIG. 2. The drain electrode DT includes a portion of which a lower surface is provided in contact with the oxide semiconductor film SC and a portion provided on the right side of the above-mentioned portion and extends on the channel protective film CS. A leading end of the portion extending on the channel protective film CS overlaps with the oxide semiconductor film SC, the channel protective film CS, and the gate electrode GT in plan view. Further, the source electrode ST is positioned apart from the leading end of the drain electrode DT, and extends in the right direction from a position at which the source electrode ST overlaps with the oxide semiconductor film SC, the channel protective film CS, and the gate electrode GT in plan view. Further, in FIG. 2, the source electrode ST is upwardly bent in the middle to be connected to the pixel electrode PX. The source electrode ST includes a portion extending on the channel protective film CS, and a portion provided on the right side of the above-mentioned portion, in which a lower surface thereof is provided in contact with the oxide semiconductor film SC. A leading end of the source electrode ST is included in the portion extending on the channel protective film CS.

The oxide semiconductor film SC has a rectangular planar shape, and an upper surface thereof is covered with the channel protective film CS at a longitudinal center portion thereof. Further, the gate electrode GT extends in a vertical direction of FIG. 2 so as to overlap in plan view with a part of a portion at which the oxide semiconductor film SC and the channel protective film CS overlap with each other in plan view, the part being separated from left and right ends of the portion by predetermined intervals. The gate electrode GT has a lower end connected to the gate signal line GL.

FIG. 3 is a sectional view of the thin film transistor TFT included in the pixel circuit. FIG. 3 illustrates a cross section taken along the cut line of FIG. 2. On a glass substrate SUB, a conductive layer including the gate electrode GT provided in contact with the glass substrate SUB is provided. On the conductive layer, a gate insulating layer GI is provided. The gate insulating layer GI includes a silicon oxide film as an insulating material. The oxide semiconductor film SC is provided in contact with an upper surface of the gate insulating layer GI, and is provided above the gate electrode GT. The channel protective film CS is provided in contact with a region of the upper surface of the oxide semiconductor film SC, and the region is wider than the region which overlaps with the gate electrode GT and includes the latter region. The channel protective film CS includes, as the insulating material, the same silicon oxide film as that of the gate insulating layer GI. A source electrode contact region R1 of the upper surface of the oxide semiconductor film SC, which is provided on a right side of the region provided in contact with the channel protective film CS, is provided in contact with a part of the lower surface of the source electrode ST. A drain electrode contact region R2 of the upper surface of the oxide semiconductor film. SC, which is provided on a left side of the region provided in contact with the channel protective film CS, is provided in contact with a part of a lower surface of the drain electrode DT. A passivation film PL is provided on the source electrode ST, the drain electrode DT, and the channel protective film. CS, to thereby cover the thin film transistor TFT. In this embodiment, the gate insulating layer GI and the channel protective film CS are only required to be made of the same insulating material, and the material is not necessarily a silicon oxide. For example, the gate insulating layer GI and the channel protective film CS may be each formed of a silicon nitride film, a laminate film of the silicon oxide film and the silicon nitride film, or other metal oxide films.

In this case, in plan view, the oxide semiconductor film SC includes a channel portion PC formed of a part of a portion which overlaps with the gate electrode GT, a low resistance portion PL1 connecting the channel portion PC and the source electrode ST to each other, and a low resistance portion PL2 connecting the channel portion PC and the drain electrode DT to each other. The upper surface of the oxide semiconductor film SC includes a channel upper region RC, gate upper connection regions RL1 and RL2, gate outer connection regions RM1 and RM2, the source electrode contact region R1, and the drain electrode contact region R2. The channel upper region RC is also an upper surface of the channel portion PC. The gate upper connection region RL1, the gate outer connection region RM1, and the source electrode contact region R1 are also an upper surface of the low resistance portion PL1, and the gate upper connection region RL2, the gate outer connection region RM2, and the drain electrode contact region R2 are also an upper surface of the low resistance portion PL2. Further, the channel portion PC is a portion of the oxide semiconductor film SC, which overlaps with the channel upper region RC in plan view. The low resistance portion PL1 is a portion of the oxide semiconductor film SC, which overlaps with the gate upper connection region RL1, the gate outer connection region RM1, and the source electrode contact region R1 in plan view. The low resistance portion PL2 is a portion of the oxide semiconductor film SC, which overlaps with the gate upper connection region RL2, the gate outer connection region RM2, and the drain electrode contact region R2 in plan view.

The gate upper connection region RL1 is a region which overlaps with the gate electrode GT in plan view, and a left end thereof is provided in contact with the channel upper region RC provided at the upper surface of the channel portion PC. A left end of the gate outer connection region RM1 is provided in contact with the gate upper connection region RL1, and a right end thereof is provided in contact with the source electrode contact region R1. The gate upper connection region RL2 is a region which overlaps with the gate electrode GT in plan view, and a right end thereof is provided in contact with the channel upper region RC. A right end of the gate outer connection region RM2 is provided in contact with the gate upper connection region RL2, and a left end thereof is provided in contact with the drain electrode contact region R2. The channel upper region RC, the gate upper connection regions RL1 and RL2, and the gate outer connection regions RM1 and RM2 are provided in contact with the channel protective film CS.

In this case, portions of the oxide semiconductor film SC, which overlap with the gate outer connection regions RM1 and RM2 are parts of the low resistance portions PL1 and PL2, respectively. The gate outer connection regions RM1 and RM2 are regions provided in contact with the channel protective film CS but do not overlap with the gate electrode GT in plan view. If the entire oxide semiconductor film SC is a semiconductor having the same resistance value as that of the channel portion PC, the resistance of this transistor becomes large, and currents are less likely to flow. This is because a resistance value of a portion of the oxide semiconductor film SC, which overlaps with the gate outer connection regions RM1 and RM2, the source electrode contact region R1, and the drain electrode contact region R2 in plan view does not change so much by a potential applied to the gate electrode GT. Otherwise, in the thin film transistor TFT of this embodiment, the low resistance portions PL1 and PL2 having a low oxygen content are provided, to thereby suppress the resistance in a range to be workable. Further, it is possible to suppress electric field concentration at portions at which the oxide semiconductor film SC and the source electrode ST as well as the drain electrode DT are provided in contact to each other, which reduces an OFF current to improve the reliability. Further, the gate outer connection regions RM1 and RM2 are provided to improve the withstand voltage of the thin film transistor TFT, and the mechanism thereof is described later.

Hereinafter, manufacturing steps for the above-mentioned thin film transistor TFT are described. FIGS. 4A to 4F are sectional views illustrating the manufacturing steps for the thin film transistor TFT illustrated in FIG. 3. In the first step, on the glass substrate SUB, an Al layer having a thickness of 350 nm and an Mo layer having a thickness of 100 nm are sequentially formed by sputtering, and are subjected to photolithography and wet etching to form the gate electrode GT (see FIG. 4A). As the gate electrode GT, there may be used a single layer made of a low resistance metal such as Al, Mo, W, Cu, a Cu—Al alloy, an Al—Si alloy, and an Mo—W alloy, or a laminate structure of those layers. In the next step, on the glass substrate SUB having the gate electrode GT formed thereon, a silicon oxide film forming the gate insulating layer GI is formed (see FIG. 4B). The silicon oxide film is formed by using a plasma CVD device, and formation conditions thereof are a substrate temperature of 400° C., a monosilane flow rate of 20 sccm, and an $N_2O$ flow rate of 300 sccm.

In the next step, an oxide semiconductor is sputtered to form an oxide semiconductor layer SL (see FIG. 4C). As a measure of the sputtering of the oxide semiconductor, a DC sputtering is used. A target material is a material having a ratio of In:Ga:Zn:O=1:1:1:4, and formation conditions thereof are a substrate temperature of 25° C., an Ar flow rate of 30 sccm, and an oxygen flow rate of 15 sccm. The oxide semiconductor layer SL may be alternatively formed by an evaporation method, a coating method, and a thermal CVD method.

In the next step, a resist RG is coated on the oxide semiconductor layer SL, and then patterning is performed so that the resist RG covers a portion corresponding to the upper surface of the channel portion PC. The patterned resist RG does not cover regions corresponding to the gate upper connection regions RL1 and RL2. Then, a deoxidation step is performed, in which hydrogen plasma is applied to deoxidize a portion of the oxide semiconductor layer SL, which is not covered with the resist RG (see FIG. 4D). The temperature of the hydrogen plasma is set to 320° C., but may be within a range of 100° C. to 450° C. The conditions may be adjusted so that the oxygen density of the portion of the oxide semiconductor layer SL, which is not covered with the resist RG, is ½ of the oxygen density of the channel portion PC or lower, desirably ⅕ of the oxygen density of the channel portion PC or lower. At this time, with plasma treatment using $N_2$, Ar, or the like, the oxide semiconductor layer SL may be damaged to deoxidize the oxide semiconductor layer SL. After the deoxidation step, the resist RG is removed. Note that, in order to dehydrogenate the semiconductor layer SL, annealing treatment may be performed after the deoxidation step. When the annealing treatment is performed, it is desired that the temperature be set in a range of 100° C. to 450° C., and the atmosphere be moisture, nitrogen, atmosphere, hydrogen, and a rare gas such as Ar. However, those conditions are not necessarily satisfied.

In the next step, a channel protective layer for forming the channel protective film CS is formed of a silicon oxide film. This step is performed using a plasma CVD device, and formation conditions thereof are a substrate temperature of 150° C., a monosilane flow rate of 5 sccm, and an $N_2O$ flow rate of 500 sccm. In this step, the channel protective layer is further subjected to photolithography and dry etching, to thereby form the channel protective film CS. In this step, the channel protective film CS is formed so that the channel protective film CS is provided in contact with the upper surface of the portion of the oxide semiconductor film SC, which overlaps with the gate electrode GT in plan view, and upper surfaces of portions provided on the outer sides of the above-mentioned portion. Further, by photolithography and wet etching, the oxide semiconductor film SC is formed (see FIG. 4E).

Figure 4D:
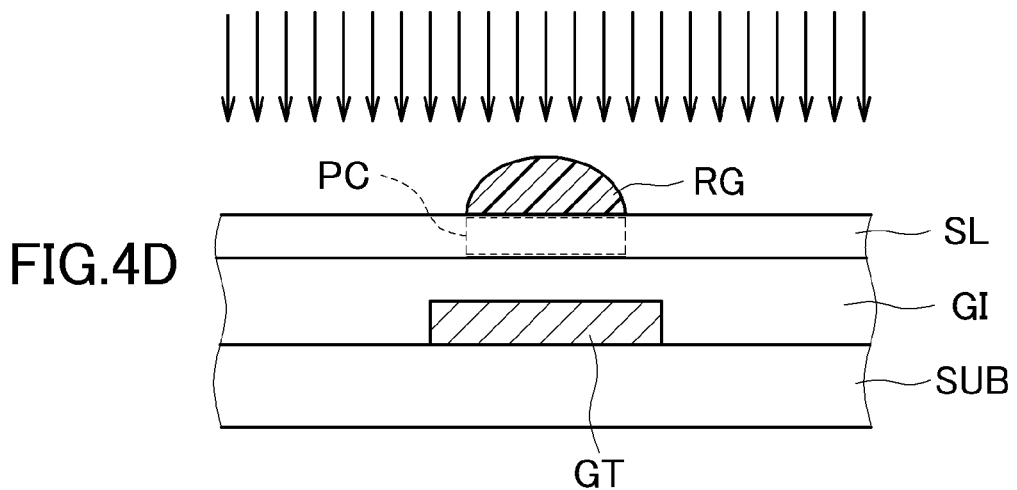
Figure 4E:
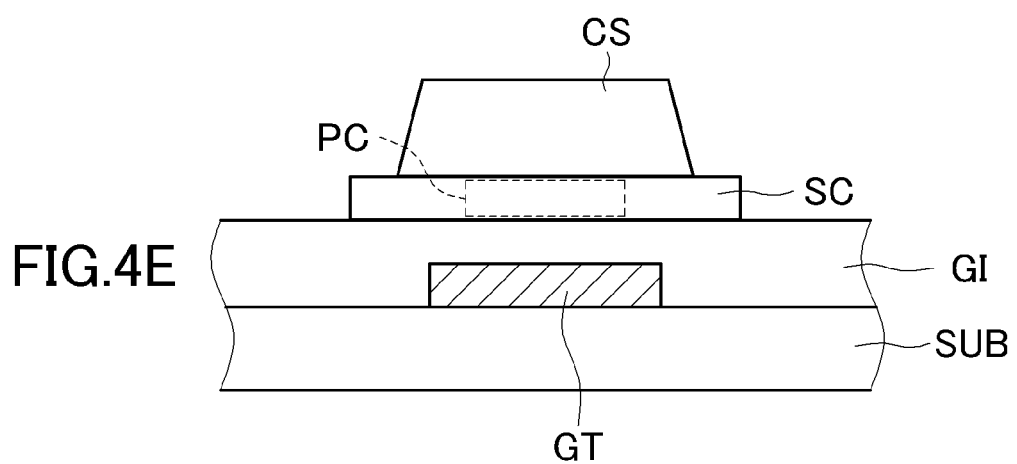
Figure 4F:
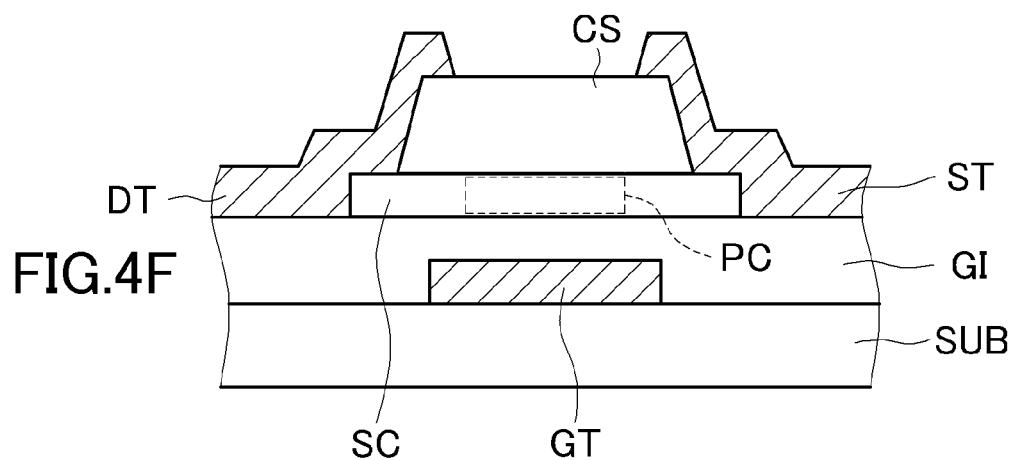

In the next step, in order to form the source electrode ST and the drain electrode DT, a Ti layer having a thickness of 100 nm, an AlSi layer having a thickness of 450 nm, and a Ti layer having a thickness of 100 nm are sequentially formed, and those films are subjected to processing of photolithography and dry etching, to thereby form the source electrode ST and the drain electrode DT (see FIG. 4F). Instead of forming the above-mentioned layers, there may be used a single layer made of a low resistance metal such as Al, Mo, W, Cu, a Cu—Al alloy, an Al—Si alloy, and an Mo—W alloy, or a laminate structure of those layers.

In the next step, a silicon oxide film for forming the passivation film PL which prevents intrusion of moisture or impurities from outside is formed by a PECVD method. The film formation is performed by using a plasma CVD device, and formation conditions thereof are a substrate temperature of 150° C., a monosilane flow rate of 20 sccm, and an $N_2O$ flow rate of 300 sccm. Further, a transparent conductive film is used to form the pixel electrode PX and the common electrode CT. In this manner, the display device including the thin film transistor TFT illustrated in FIG. 3 is completed.

Figure 5:
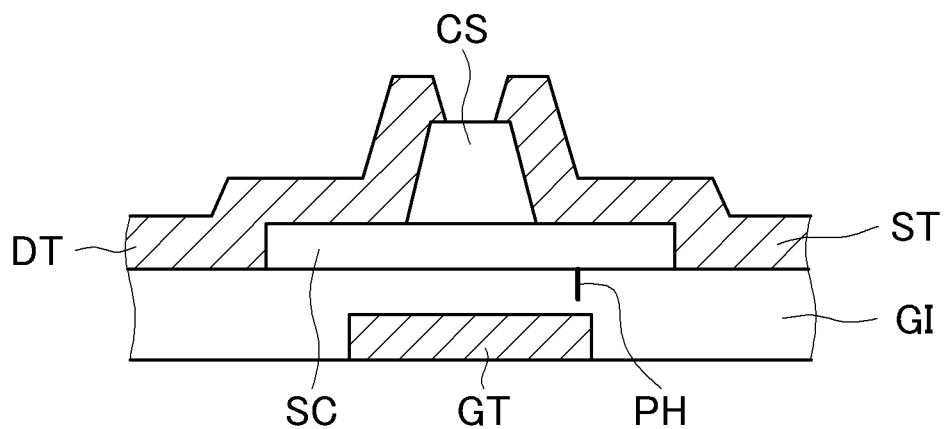
FIG. 5 is a sectional view illustrating a comparative example of the thin film transistor.

Now, description is made of a pinhole PH to be generated in the step of forming the channel protective film CS. FIG. 5 is a sectional view illustrating a comparative example of the thin film transistor TFT. In the comparative example illustrated in FIG. 5, the channel protective film CS overlaps with only a part of the gate electrode GT in plan view. The oxide semiconductor film SC is provided with a through hole, and hence when the channel protective film CS is subjected to etching, the pinhole PH is generated in a portion of the gate insulating layer GI above the gate electrode GT. This pinhole PH causes the withstand voltage performance between the gate electrode GT and the oxide semiconductor film SC to decrease.

Figure 6:
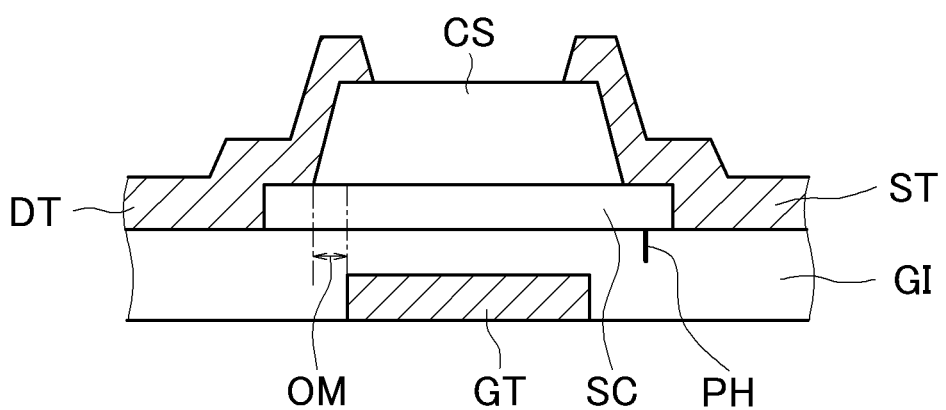
FIG. 6 is a sectional view illustrating a pinhole generated in the thin film transistor of the embodiment of the present invention.

On the other hand, in the thin film transistor TFT illustrated in FIG. 3, the pinhole PH is not generated in the vicinity of the gate electrode GT. FIG. 6 is a sectional view illustrating the pinhole PH generated in the thin film transistor of TFT in this embodiment. In plan view, there is a margin OM between the gate electrode GT and a region in which the pinhole PH may be generated by etching because the channel protective film CS is absent. Therefore, even when the pinhole PH is generated, no influence from the gate electrode GT is exerted. With this mechanism, reduction of the withstand voltage of the thin film transistor TFT can be suppressed. Note that, the width of the margin OM may be experimentally set so as to maintain the necessary withstand voltage performance.

Note that, in the liquid crystal display device according to the embodiment of the present invention described above, a driving type of the liquid crystal is an IPS type, but in the present invention, other driving types such as a vertically aligned (VA) type and a twisted nematic (TN) type may be employed. FIG. 7 is a circuit diagram illustrating an equivalent circuit of another display device according to the embodiment of the present invention. The equivalent circuit illustrated in FIG. 7 is an equivalent circuit of an array substrate forming a VA type or a TN type display device. FIG. 8 is a plan view illustrating a configuration of a pixel circuit illustrated in FIG. 7. In the IPS type, the common electrode CT and the common signal line CL are provided on the array substrate, but in the VA type and the TN type, an electrode corresponding to the common electrode CT is provided to a counter substrate (or a color filter substrate) (not shown) opposed to the array substrate. Even when the present invention is applied to those types, the relationship between the channel protective film CS and the gate electrode GT of the thin film transistor TFT may not be changed, and hence the similar effects can be obtained.

Note that, the embodiment of the present invention is described above as the liquid crystal display device, but the present invention is not limited thereto. It is needless to say that, as long as a similar structure of laminating an insulating layer or a conductive layer is included, the present invention is applicable to other display devices such as an organic electroluminescence (EL) display device and the like.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device, comprising:
an insulating substrate; and
a thin film transistor formed on the insulating substrate,
wherein the thin film transistor comprises:
- a conductive layer provided with a gate electrode;
- a gate insulating layer which is provided on the conductive layer and contains an insulating material;
- an oxide semiconductor film which is provided in contact with an upper surface of the gate insulating layer and is provided above the gate electrode;
- a source electrode which is provided in contact with a first region provided in an upper surface of the oxide semiconductor film;
- a drain electrode which is provided in contact with a second region spaced apart from the first region, the second region being provided in the upper surface of the oxide semiconductor film; and
- a channel protective film which contains the insulating material and is provided in contact with a third region provided between the first region and the second region, the third region being provided in the upper surface of the oxide semiconductor film, wherein, in plan view, a first portion of the oxide semiconductor film, which overlaps with the gate electrode, is a part of a larger second portion of the oxide semiconductor film, which overlaps with the channel protective film, and wherein a portion of the oxide semiconductor film, except for at least one part of the first portion of the oxide semiconductor film, has a resistance lower than a resistance of another part of the first portion of the oxide semiconductor film.

2. The display device according to claim 1, wherein the insulating material is a silicon oxide.

3. The display device according to claim 1,
wherein the oxide semiconductor film has, in plan view, a portion which overlaps with the third region between the portion which overlaps with the gate electrode and a portion which overlaps with the first region, and
wherein the oxide semiconductor film has, in plan view, a portion which overlaps with the third region between the portion which overlaps with the gate electrode and a portion which overlaps with the second region.

4. The display device according to claim 1, wherein the third region is provided in contact with the first region and the second region.

5. The display device according to claim 1, wherein the portion of the oxide semiconductor film, except for the at least one part of the first portion of the oxide semiconductor film, has an oxygen content lower than an oxygen content of the another part of the first portion of the oxide semiconductor film.

6. The display device according to claim 5, wherein the at least one part of the first portion of the oxide semiconductor film and the another part of the first portion of the oxide semiconductor film overlap with the gate electrode.

7. The display device according to claim 1, wherein the at least one part of the first portion of the oxide semiconductor film and the another part of the first portion of the oxide semiconductor film overlap with the gate electrode.

8. The display device according to claim 1, wherein a portion of the oxide semiconductor film which is in contact with and overlaps with the channel protective film has a dimension greater than a dimension of a portion of the oxide semiconductor film which overlaps with the gate electrode.

9. The display device according to claim 8, wherein the oxide semiconductor film has a dimension greater than the dimension of the portion of the oxide semiconductor film which is in contact with and overlaps with the channel protective film.

* * * * *